US012805214B2

(12) United States Patent
Chudzik et al.

(10) Patent No.: US 12,805,214 B2
(45) Date of Patent: Nov. 17, 2026

(54) NUCLEATION LAYERS FOR GROWTH OF GALLIUM-AND-NITROGEN-CONTAINING REGIONS

(71) Applicant: Applied Materials, Inc., Santa Clara, CA (US)

(72) Inventors: Michael Chudzik, Mountain View, CA (US); Ria Someshwar, Mountain View, CA (US); Daniel Deyo, Austin, TX (US); Michel Khoury, Mountain View, CA (US); Sha Zhao, Xi'an (CN)

(73) Assignee: Applied Materials, Inc., Santa Clara, CA (US)

( * ) Notice: Subject to any disclaimer, the term of this patent is extended or adjusted under 35 U.S.C. 154(b) by 123 days.

(21) Appl. No.: 17/697,058

(22) Filed: Mar. 17, 2022

(65) Prior Publication Data

US 2022/0319836 A1 Oct. 6, 2022

Related U.S. Application Data

(63) Continuation of application No. PCT/CN2021/085425, filed on Apr. 2, 2021.

(51) Int. Cl.
*H10P 14/20* (2026.01)
*H10P 14/24* (2026.01)
(Continued)

(52) U.S. Cl.
CPC .......... *H10P 14/3416* (2026.01); *H10P 14/24* (2026.01); *H10P 14/2905* (2026.01);
(Continued)

(58) Field of Classification Search
CPC ............. H01L 21/0254; H01L 21/0217; H01L 21/02178; H01L 21/02181;
(Continued)

(56) References Cited

U.S. PATENT DOCUMENTS

| | | | |
|---|---|---|---|
| 7,745,333 | B2 | 6/2010 | Lai et al. |
| 9,293,640 | B2 | 3/2016 | Hertkorn et al. |

(Continued)

FOREIGN PATENT DOCUMENTS

| | | |
|---|---|---|
| CN | 103915537 A | 7/2014 |
| CN | 104508840 A | 4/2015 |

(Continued)

OTHER PUBLICATIONS

Fareed et al, "Metal-Organic Hydride Vapor Phase Epitaxy of AlxGa1-xN Films over Sapphire," Jpn. J. Appl. Phys. 46, 2007, L752-L754. (Year: 2007).*

International Search Report and Written Opinion mailed Jan. 5, 2022 in International Patent Application No. PCT/CN2021/085425, 13 pages.

"Partial Supplementary European Search Report", for Application No. EP21934119.5-1103, mailed Oct. 18, 2024, 13 pages.

(Continued)

*Primary Examiner* — Julia Slutsker

(74) *Attorney, Agent, or Firm* — Kilpatrick Townsend & Stockton LLP

(57) ABSTRACT

Exemplary processing methods include forming a nucleation layer on a substrate. The nucleation layer may be formed by physical vapor deposition (PVD), and the physical vapor deposition may be characterized by a deposition temperature of greater than or about 700° C. The methods may further include forming a patterned mask layer on the nucleation layer. The patterned mask layer may include openings that expose portions of the nucleation layer. Gallium-and-nitrogen-containing regions may be formed on the exposed portions of the nucleation layer. In additional embodiments, the nucleation layer may include a first and second portion separated by an interlayer that stop the propagation of at least some dislocations in the nucleation layer.

13 Claims, 5 Drawing Sheets

(51) Int. Cl.

| | |
|---|---|
| ***H10P 14/60*** | (2026.01) |
| ***H10P 14/692*** | (2026.01) |
| ***H10P 14/694*** | (2026.01) |
| ***H10P 76/40*** | (2026.01) |

(52) U.S. Cl.

CPC .... *H10P 14/6329* (2026.01); *H10P 14/69391* (2026.01); *H10P 14/69392* (2026.01); *H10P 14/69394* (2026.01); *H10P 14/69395* (2026.01); *H10P 14/69433* (2026.01); *H10P 76/405* (2026.01)

(58) Field of Classification Search

CPC ......... H01L 21/02186; H01L 21/02189; H01L 21/02266; H01L 21/0262; H01L 21/0332; H01L 21/02458; H01L 21/02642; H01L 21/02639; H10P 14/3416; H10P 14/24; H10P 14/2905; H10P 14/6329; H10P 14/69391; H10P 14/69392; H10P 14/69394; H10P 14/69395; H10P 14/69433; H10P 76/405; H10P 14/272; H10P 14/3202; H10P 14/3216; H10P 14/3248; H10P 14/271; H10P 14/38; H10P 14/693; C30B 25/04; C30B 25/183; C30B 29/406

See application file for complete search history.

(56) References Cited

U.S. PATENT DOCUMENTS

| | | | | |
|---|---|---|---|---|
| 10,581,398 | B2 | 3/2020 | Gibb et al. | |
| 2005/0202682 | A1* | 9/2005 | Kiyoku | C23C 16/303 438/762 |
| 2006/0189019 | A1 | 8/2006 | Lee et al. | |
| 2009/0142870 | A1* | 6/2009 | Miki | C23C 14/0641 438/46 |
| 2015/0187985 | A1 | 7/2015 | Hertkorn et al. | |
| 2021/0040605 | A1* | 2/2021 | Guo | H01J 37/34 |
| 2023/0073455 | A1* | 3/2023 | Cheng | H01L 21/02639 |

FOREIGN PATENT DOCUMENTS

| | | | |
|---|---|---|---|
| CN | 105810725 | A | 7/2016 |
| CN | 109065438 | A | 12/2018 |
| KR | 19990062035 | A | 7/1999 |
| WO | 0229873 | A1 | 4/2002 |
| WO | 2014/048805 | A1 | 4/2014 |

OTHER PUBLICATIONS

Extended European Search Report, for Application No. EP21934119.5-1103, mailed Jan. 10, 2025, 11 pages.

Singaporean Application No. 11202307315X, Written Opinion mailed on Jan. 7, 2026, 12 pages.

* cited by examiner

NUCLEATION LAYERS FOR GROWTH OF GALLIUM-AND-NITROGEN-CONTAINING REGIONS

CROSS-REFERENCES TO RELATED APPLICATIONS

This application is a continuation of International Patent Application Number PCT/CN2021/085425 filed Apr. 2, 2021, entitled "NUCLEATION LAYERS FOR GROWTH OF GALLIUM-AND-NITROGEN-CONTAINING REGIONS," the entire disclosure of which is hereby incorporated by reference, for all purposes, as if fully set forth herein.

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

The present technology includes exemplary semiconductor processing methods that include forming a nucleation layer on a substrate. The nucleation layer may be formed by physical vapor deposition (PVD), and the physical vapor deposition may be characterized by a deposition temperature of greater than or about 400° C. The methods may further include forming a patterned mask layer on the nucleation layer. The patterned mask layer may include openings that expose portions of the nucleation layer. Gallium-and-nitrogen-containing regions may be formed on the exposed portions of the nucleation layer.

In additional embodiments, the substrate may include silicon. In further embodiments, the nucleation layer may include at least one metal nitride selected from aluminum nitride, hafnium nitride, niobium nitride, zirconium nitride, titanium nitride, and tungsten nitride. In still additional embodiments, the patterned mask layer may include silicon oxide, silicon-oxy-carbon, silicon nitride, titanium nitride, aluminum oxide, or amorphous carbon. In yet further embodiments, the forming of the nucleation layer may include forming a first portion of the nucleation layer at a first PVD deposition rate, and forming a second portion of the nucleation layer at a second PVD deposition rate that is greater than the first deposition rate. In additional embodiments, the formation of the nucleation layer may also include forming an interlayer on the first portion of the nucleation layer before the formation of the second portion of the nucleation layer. In further embodiments, the interlayer may include silicon nitride. In yet additional embodiments, the forming of the gallium-and-nitrogen-containing regions may include the formation of gallium nitride (GaN) regions with metal-organic chemical vapor deposition (MOCVD). In still further embodiments, the method may include annealing the gallium-and-nitrogen-containing regions.

The present technology also includes additional semiconductor processing methods that may include forming a first portion of a nucleation layer on a silicon substrate using physical vapor deposition. The methods may also include forming an interlayer on the first portion of the nucleation layer, where the interlayer is characterized by a thickness of less than or about 10 nm. The interlayer may include at least one opening to expose the first portion of the nucleation layer. The methods may yet further include forming a second portion of the nucleation layer on the interlayer. The second portion of the nucleation layer may be characterized by fewer dislocations than the first portion of the nucleation layer. The methods may still also include forming at least one gallium-and-nitrogen-containing region on at least one exposed part of the second portion of the nucleation layer.

In additional embodiments, the first and second portions of the nucleation layer may include aluminum nitride. In still further embodiments, the interlayer may include silicon nitride. In yet additional embodiments, the at least one gallium-and-nitrogen-containing region may include gallium nitride deposited by metal-organic chemical vapor deposition. In still more embodiments, the first and second portions of the nucleation layer may be deposited at a PVD deposition temperature greater than or about 700° C. In additional embodiments, the first portion of the nucleation layer, the interlayer, and the second portion of the nucleation layer may be formed without the silicon substrate being exposed to air.

The present technology further includes semiconductor structures that may include a silicon substrate and a nucleation layer in contact with the silicon substrate. The nucleation layer may include a first portion having a first surface in contact with the silicon substrate. The nucleation layer may also include an interlayer in contact with a second surface of the first portion of the nucleation layer, where the second surface is opposite the first surface. The nucleation layer may still further include a second portion of the nucleation layer in contact with the a second interlayer surface that is opposite the first interlayer surface in contact with the first portion of the nucleation layer. The semiconductor structure may also include at least one gallium nitride region in contact with at least one exposed part of the second portion of the nucleation layer that is opposite the interlayer.

In additional embodiments, the first and second portions of the nucleation layer of the semiconductor structure may include aluminum nitride. In still further embodiments, the interlayer may be characterized by a thickness of less than or about 10 nm, and may include at least one opening to expose the first portion of the nucleation layer. In yet additional embodiments, the second portion of the nucleation layer may make direct contact with the first portion of the nucleation layer through the at least one opening in the interlayer. In more embodiments, the second portion of the nucleation layer may be characterized by fewer dislocations that the first portion of the nucleation layer.

Such technology may provide numerous benefits over conventional semiconductor processing methods and structures. For example, embodiments of the processing methods may produce a nucleation layer by PVD in less time, and at lower temperatures, than a conventional nucleation layer formed by MOCVD. In further embodiments, the processing methods may produce a two-part, high-quality nucleation layer with significantly fewer crystal dislocations and other defects than a one-part nucleation layer grown continuously from an underlying substrate. The high-quality nucleation layer permits the formation a high-quality gallium-and-nitrogen containing region on the nucleation layer. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
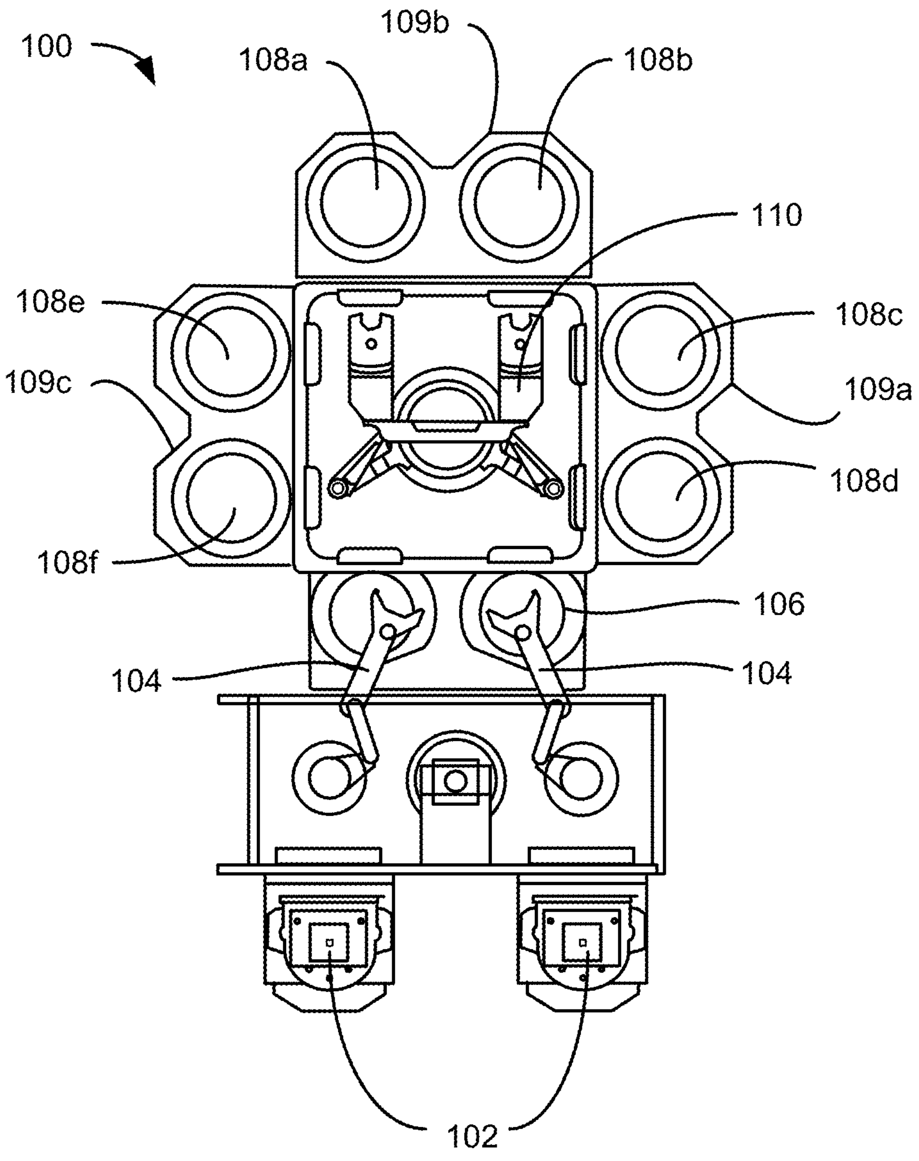
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Gallium-and-nitrogen-containing materials, including gallium nitride (GaN), aluminum-indium-gallium-nitride (AlInGaN), indium-gallium-nitride (InGaN), and aluminum-gallium nitride (AlGaN), are used in a variety of semiconductor devices, including high-power transistors, semiconductor power devices, radio-frequency devices, photovoltaic devices, light emitting diodes, and solid-state lasers, among other semiconductor devices. Gallium nitride doped with additional Group III metals such as aluminum and indium are used in a variety of light-emitting devices and displays such as micro-LEDs. Unfortunately, growing gallium-and-nitrogen-containing materials on conventional semiconductor substrates such as a silicon wafer presents a number of challenges. For example, there is a low-temperature eutectic point (i.e., about 30° C.) at the GaN/Si interface. The low eutectic point relative to typical GaN growth temperatures (e.g., greater than or about 1000° C. for MOCVD) leads to the depositing GaN creating a meltback etch in the silicon substrate that inhibits GaN nucleation on the substrate. In addition, GaN and silicon have different crystal structures that reduce the stability of GaN regions formed on silicon. GaN has a hexagonal wurtzite crystal structure, while silicon has a face-centered cubic crystal structure. Even when GaN is grown on silicon oriented to have the smallest lattice mismatch (i.e., Si[111]) there is still significant tensile strain caused by the mismatch. This strain is further exacerbated by the large difference in the thermal expansion coefficients between GaN ($\alpha_{GaN}$=5.59×$10^{-6}$ $K^{-1}$) and silicon ($\alpha_{Si}$=2.6×$10^{-6}$ $K^{-1}$). When the as-deposited GaN regions cool on the silicon substrate, the mismatch in lattices and thermal expansion coefficients can create an unacceptable amount of tensile strain, defect density, and cracking in the GaN regions.

One approach addressing the problem of forming gallium-and-nitrogen-containing regions directly on silicon substrates has been to put a buffer layer (e.g., a nucleation layer) between the silicon substrate and the gallium-and-nitrogen-containing regions. Conventional nucleation layers consist of aluminum nitride deposited on the silicon substrate using the same metal-organic chemical-vapor-deposition techniques that are used to deposit the gallium-and-nitrogen-containing regions. The AlN layer is typically deposited at a temperature greater than 1000° C. over a period of several minutes. The high deposition temperatures and long deposition times are needed to deposit an AlN layer with a low density of defects that could otherwise add significant strain on the subsequently formed gallium-and-nitrogen-containing regions. Unfortunately, the high temperatures and long deposition times slow production rates while increasing the complexity and costs of producing gallium-and-nitrogen-containing semiconductor structures and devices.

Embodiments of the present technology address the problems with conventional MOCVD methods of making a nucleation layer for the growth of gallium-and-nitrogen-containing regions by forming the nucleation layer with a lower-temperature physical vapor deposition method. PVD of a nucleation layer on a substrate layer may be done at lower temperatures and faster deposition rates than MOCVD. In embodiments, the PVD methods form a nucleation layer at lower temperatures and shorter deposition times than conventional MOCVD methods. This increases production rates while reducing the complexity and costs of producing gallium-and-nitrogen-containing semiconductor structures and devices. Embodiments of the present technology also include forming a nucleation layer in two or more portions with an interlayer formed between the portions of the nucleation layer. In these embodiments, at least some of the lattice mismatches and propagated dislocations (e.g., threading dislocations) originating at the interface of the first portion of the nucleation layer and the substrate are interrupted by the interlayer. The second portion of the nucleation layer formed on the interlayer have fewer mismatches and dislocations that the first portion, and create less stress in the gallium-and-nitrogen containing regions formed on the nucleation layer.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including the physical vapor deposition processes described herein in addition to dry etch processes, cyclical layer deposition processes, atomic layer deposition processes, chemical vapor deposition processes including metal-organic chemical vapor deposition processes, etch processes, pre-clean processes, planarizing processes including chemical-mechanical-polishing processes, anneal processes, plasma processing processes, degas processes, orientation processes, and other semiconductor fabrication processes.

The substrate processing chambers 108*a-f* may include one or more system components for depositing, annealing, curing and/or etching a material film on the substrate or wafer. In one configuration, two pairs of the processing chambers, for example 108*c-d* and 108*e-f*, may be used to deposit material on the substrate, and the third pair of processing chambers, for example 108*a-b*, may be used to planarize, anneal, cure, or treat the deposited films. In another configuration, all three pairs of chambers, for example 108*a-f*, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
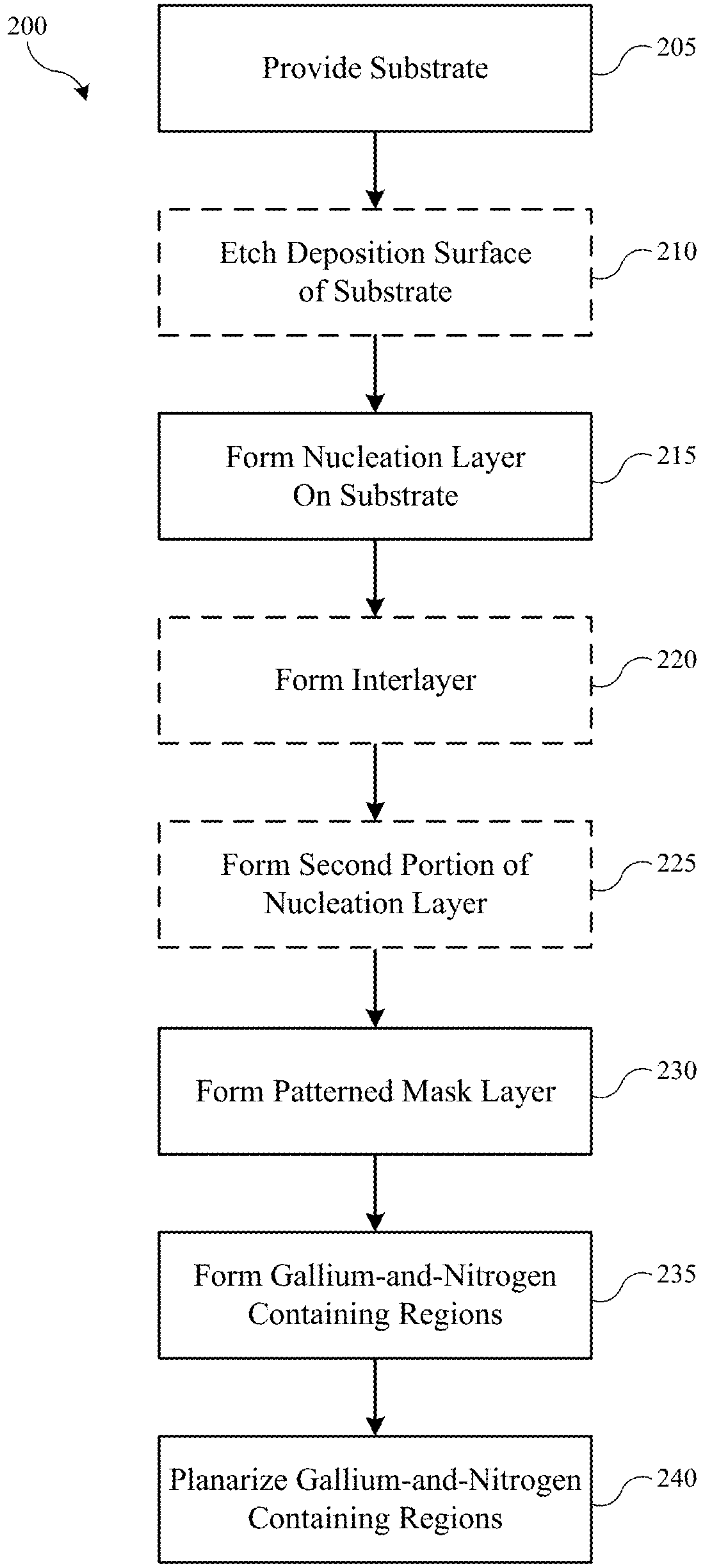
FIG. 2 shows exemplary operations in a method of forming semiconductor devices according to some embodiments of the present technology.
Figure 3:
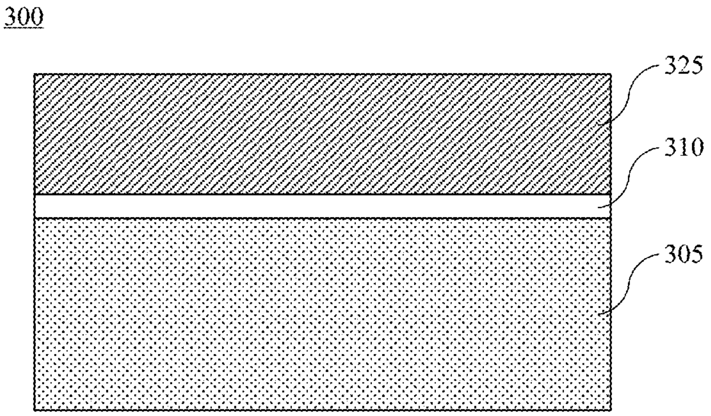
FIG. 3 shows a cross-sectional view of a semiconductor structure according to embodiments of the present technology.

System 100, or more specifically chambers incorporated into system 100 or other processing systems, may be used to produce semiconductor structures according to some embodiments of the present technology. FIG. 2 shows exemplary operations in a method 200 of forming a semiconductor structure according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations, which may or may not be specifically associated with some embodiments of methods according to the present technology. Method 200 describes operations to form embodiments of semiconductor structures shown in a simplified schematic form in FIG. 3, FIG. 4, and FIGS. 5A-D, the illustrations of which will be described in conjunction with the operations of method 200. It should be understood that FIG. 3, FIG. 4, and FIGS. 5A-D illustrate only partial schematic views with limited details, and in some embodiments a substrate may contain any number of semiconductor sections having aspects as illustrated in the figures, as well as alternative structural aspects that may still benefit from any of the aspects of the present technology.

The embodiment described in method 200 includes operations to develop a semiconductor structure. In embodiments, method 200 may include providing a substrate at operation 205. In the embodiments of the semiconductor structures shown in FIG. 3, FIG. 4, and FIGS. 5A-D, the substrates 305, 405, and 505 are a single-material, base structure upon which the subsequently-deposited layers are formed, including the nucleation layer and the gallium-and-nitrogen-containing regions. In additional embodiments, the substrate may have additional materials (not shown) formed on the base structure before depositing the nucleation layer, gallium-and-nitrogen-containing regions and other components of the semiconductor structure. For purposes of simplifying the description, substrates 305, 405, and 505 will be referred to as substrate 305 with the understanding that this description equally applies to substrates 405 and 505 shown in FIG. 4 and FIGS. 5A-D, respectively. Similarly, the descriptions of nucleation layer 310 in FIG. 3, nucleation layer 410*a-b* in FIG. 4, and nucleation layer 510 in FIGS. 5A-D, will be referred to as nucleation layer 310 unless otherwise indicated. Also, the description of gallium-and-nitrogen-containing region 315 in FIG. 3, gallium-and-nitrogen-containing region 415 in FIG. 4, and gallium-and-nitrogen-containing regions 515*a-c* in FIGS. 5C-D will be collectively referred to as gallium-and-nitrogen-containing region 315 unless otherwise indicated. As noted above, the gallium-and-nitrogen-containing regions may include one or more of gallium nitride (GaN), aluminum-indium-gallium-nitride (AlInGaN), indium-gallium-nitride (InGaN), and aluminum-gallium nitride (AlGaN). In some embodiments, the materials used to make the regions may be extended to include other nitride materials such as aluminum-indium-nitride (AlInN) and indium nitride (InN), among other nitride materials.

In further embodiments, providing the substrate in operation 205 may include providing a substrate wafer to a processing chamber like one of the processing chambers 108*a-f* shown in FIG. 1. In still further embodiments, the substrate 305 may be a planar material, or may be a structured device which may include multiple materials configured as posts, trenches, or other structures as would be understood are similarly encompassed by the present technology. Substrate 305 may include any number of conductive and/or dielectric materials including metals, including transition metals, post-transition metals, metalloids, oxides, nitrides, and carbides of any of these materials, as well as any other materials that may be incorporated within a structure. In embodiments, substrate 305 may be made of sapphire, silicon, or a III-V semiconductor material such as gallium nitride. In additional embodiments, the substrate 305 may be a silicon substrate having a Si[111] orientation. In further embodiments, substrate 305 may be or include silicon, which may be doped by any number of materials, as well as silicon-containing or gallium-containing materials. The doping may be n+ or n− in some operations, and the silicon may be formed or grown by any number of techniques. Additionally, in embodiments, one or more doped regions may be included in the substrate. For example any number of n- or p-doping regions may be included on the substrate.

Method 200 may optionally include preparing the substrate 305 for the formation of the nucleation layer 310 on the substrate. These preparation operations may include an optional etching operation 210 of a surface of the substrate 305 upon which the nucleation layer 310 will be deposited. In embodiments, the optional etching operation 210 may include exposing the deposition surface of the substrate 305 to a wet etchant for a period of time. In further embodiments, the wet etchant may include an aqueous inorganic acid such as hydrofluoric acid that is capable of forming soluble coordination complexes with substrate materials such as silicon. In additional embodiment, the aqueous inorganic acid may have a molar concentration of greater than or about 1 mol/L, greater than or about 2 mol/L, greater than or about 3 mol/L, greater than or about 4 mol/L, greater than or about 5 mol/L, greater than or about 6 mol/L, greater than or about 7 mol/L, greater than or about 8 mol/L, greater than or about 9 mol/L, greater than or about 10 mol/L, or more. In still additional embodiments, the deposition surface of the substrate may be exposed to the wet etchant for greater than or about 0.5 minutes, greater than or about 1 minute, greater than or about 2 minutes, greater than or about 3 minutes, greater than or about 4 minutes, greater than or about 5 minutes, or more.

Figure 4:
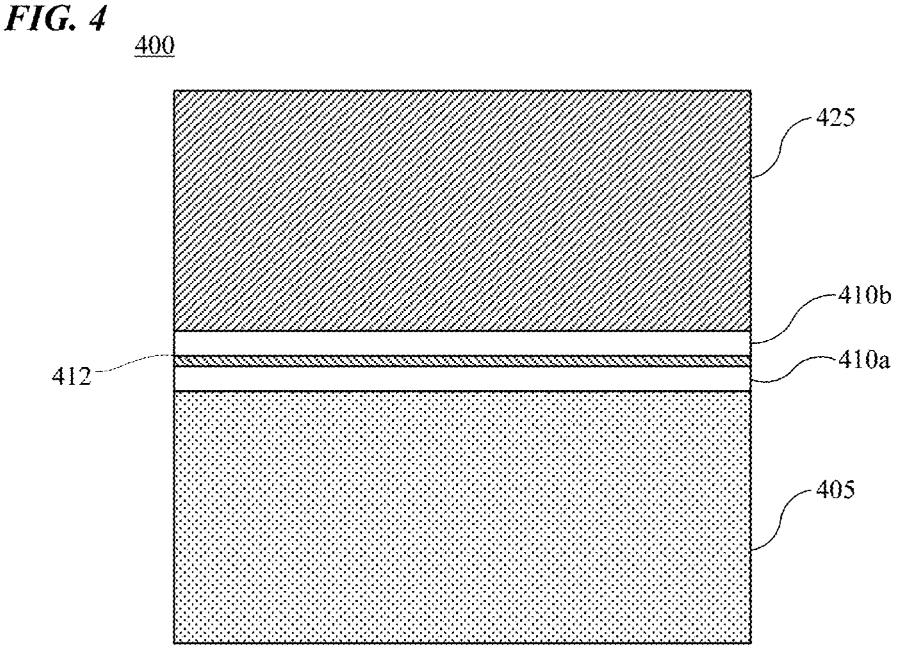
FIG. 4 shows an additional cross-sectional view of a semiconductor structure according to embodiments of the present technology.

Method 200 may further include forming a nucleation layer on the substrate at operation 215. In embodiments, the formation of the nucleation layer may include depositing a single-portion layer like nucleation layer 310 in FIG. 3. In additional embodiments, the formation of the nucleation layer may include depositing two or more portions of the nucleation layer 410*a-b* as shown in FIG. 4. In still additional embodiments, an interlayer 412 may be formed between the first and second portions of the nucleation layer 410*a-b*.

As noted above, the nucleation layer 310 may be formed directly on the substrate 305 by physical vapor deposition. In embodiments, the physical vapor deposition operation may include flowing a sputtering gas into a deposition chamber that holds the substrate 305. The sputtering gas may flow between a sputtering target and the substrate 305, which may be supported on a substrate pedestal or some other type of substrate support. In further embodiments, an electric field may be generated between the sputtering target and the substrate 305 by applying a voltage difference between them. The voltage difference may be set to ionize one or more constituents of the sputtering gas an accelerate the ions formed into the sputtering target. The bombardment of the sputtering target by the ionized constituents of the sputtering gas creates sputtered target species (e.g., un-ionized sputtered neutrals) that hit the deposition surface of the substrate 305, and, over time, form the nucleation layer 310. In additional embodiments, the sputtering gas may further include a reactive gas that reacts with the sputtered target species to deposit the material of the nucleation layer 310 on the substrate 305.

In additional embodiments, the sputtering target and the sputtering gas depend on the material used in the nucleation layer 310. Embodiments of the material used in the nucleation layer may include at least one metal nitride. In further embodiments, the at least one metal nitride in the nucleation layer 310 may include aluminum nitride (AlN). In more embodiments, the metal nitride may include one or more of niobium nitride (NbN), titanium nitride (TiN), or hafnium nitride (HfN), among other types of metal nitrides. In still additional embodiments, the metal nitride may include one or more doped gallium nitrides such as indium-gallium-nitride (InGaN), aluminum-gallium-nitride (AlGaN), and aluminum-indium-gallium-nitride (AlInGaN), among other types of doped gallium nitrides. In still further embodiments, the metal nitride may include PVD-deposited, undoped gallium nitride (GaN). In some embodiments, the nucleation layer 310 may include one or more oxide materials in addition to (or in lieu of) the nitride material. In embodiments, these oxide materials may include zinc oxide, magnesium oxide, or gallium oxide, among other oxides. In embodiments, the sputtering gas may include one or more noble gases such as neon or argon. In further embodiments, the sputtering gas may include one or more nitrogen-containing gases such as nitrogen ($N_2$) or ammonia ($NH_3$). In yet additional embodiments, the sputtering target may include one or more metal species such as aluminum, niobium, titanium, hafnium, or germanium. In embodiments, the nitrogen-containing gas may react with the sputtered target species to deposit a metal nitride (e.g., AlN) as the nucleation layer 310.

In still additional embodiments, the PVD deposition operation may be characterized by a deposition temperature of greater than or about 400° C., greater than or about 500° C., greater than or about 600° C., greater than or about 700° C., greater than or about 710° C., greater than or about 720° C., greater than or about 730° C., greater than or about 740° C., greater than or about 750° C., greater than or about 760° C., greater than or about 770° C., greater than or about 780° C., greater than or about 790° C., greater than or about 800° C., greater than or about 900° C., or more. Relative to the deposition temperature of a conventional PVD operation for a III-V material (e.g., less than 400° C.) the PVD deposition of the nucleation layer 310 may be considered high-temperature. However, relative to the deposition temperature of a conventional MOCVD operation for depositing a III-V material (e.g, greater than 1000° C.), the PVD deposition of the nucleation layer 310 may be considered low-temperature. For example, the PVD deposition operation for nucleation layer 310 may be characterized by a deposition temperature of less than or about 900° C., less than or about 875° C., less than or about 850° C., less than or about 825° C., less than or about 800° C., less than or about 700° C., less than or about 600° C., less than or about 500° C., or less.

In still additional embodiments, the PVD deposition chamber may be characterized by a pressure less than or about 25 mTorr, less than or about 20 mTorr, less than or about 15 mTorr, less than or about 12.5 mTorr, less than or about 10 mTorr, less than or about 7.5 mTorr, less than or about 5 mTorr, or less. In embodiments where the nucleation layer 310 includes a metal nitride, the relative concentration ratio of a noble gas (e.g., Ar) to a reactive nitrogen-containing gas (e.g., $N_2$) may be an Ar:$N_2$ ratio of less than or about 1:2, less than or about 1:3, less than or about 1:4, less than or about 1:5, less than or about 1:6, less than or about 1:7, less than or about 1:8, or less.

In yet further embodiments, the PVD deposition of nucleation layer 310 may include forming the layer at a single deposition rate, or forming the layer at two or more deposition rates. In embodiments, the nucleation layer 310 may be formed at two deposition rates that include a first deposition rate that is lower than the second deposition rate. In more embodiments, the deposition rate ratio between the first, lower deposition rate and the second higher, second deposition rate may be less than or about 1:2, less than or about 1:3, less than or about 1:4, less than or about 1:5, or less. In further embodiments, the first deposition rate may be less than or about 4 Å/second, less than or about 3.5 Å/second, less than or about 3 Å/second, less than or about 2.5 Å/second, less than or about 2 Å/second, less than or about 1.5 Å/second, less than or about 1 Å/second, or less. In still further embodiments, the second deposition rate may be greater than 4 Å/second, greater than or about 4.5 Å/second, greater than or about 5 Å/second, greater than or about 5.5 Å/second, greater than or about 6 Å/second, or more. In embodiments, dividing the PVD deposition of the nucleation layer 310 into two or more parts with different rates may reduce the number of defects propagated to a deposition surface of the nucleation layer. A lower first deposition rate for the initial part of the nucleation layer 310 can form that part with fewer defects at the interface of the nucleation layer and the substrate 305. The defect density is reduced as additional materials of the nucleation layer 310 are being deposited on the as-deposited part of the nucleation layer. A faster second deposition rate for the remainder of the nucleation layer 310 can reduce the overall time to form the nucleation layer 310.

In further embodiments, the differences in the first and second deposition rates may be set by applying a different amount of power to a power generator that creates the potential difference between the sputtering target and the substrate 305. In embodiments, a first power level used when forming an initially-deposited part of the nucleation layer 310 may be less than or about 1 kW, less than or about 0.9 kW, less than or about 0.8 kW, less than or about 0.7 kW, less than or about 0.6 kW, less than or about 0.5 kW, or less. In additional embodiments, a second power level used when forming a subsequently-deposited part of the nucleation layer 310 may be greater than 1 kW, greater than or about 1.5 kW, greater than or about 2 kW, greater than or about 2.5 kW, greater than or about 3 kW, greater than or about 3.5 kW, greater than or about 4 kW, greater than or about 4.5 kW, greater than or about 5 kW, or more.

In embodiments, the PVD-deposited nucleation layer 310 may be deposited in less time than a nucleation layer deposited by conventional MOCVD. In further embodiments, the deposition time for the PVD-deposited nucleation layer 310 may be less than or about 30 minutes, less than or about 25 minutes, less than or about 20 minutes, less than or about 15 minutes, less than or about 10 minutes, less than or about 9 minutes, less than or about 8 minutes, less than or about 7 minutes, less than or about 6 minutes, less than or about 5 minutes, less than or about 4 minutes, less than or about 3 minutes, less than or about 2 minutes, less than or about 1 minute, less than or about 0.5 minutes, or less. In yet further embodiments, the nucleation layer 310 may be characterized by a thickness of less than or about 2000 nm, less than or about 1500 nm, less than or about 1000 nm, less than or about 500 nm, less than or about 250 nm, less than or about 100 nm, less than or about 50 nm, less than or about 25 nm, less than or about 20 nm, less than or about 15 nm. less than or about 10 nm, or less.

Referring to FIG. 4, additional embodiments of forming the nucleation layer on the substrate may optionally include forming an interlayer 412 on a first portion of the nucleation layer 410*a* at operation 220, followed by forming a second portion of the nucleation layer 410*b* on the interlayer 412 at operation 225. In embodiments, the first portion of the nucleation layer 410*a* may be formed by PVD at a first deposition rate that is lower than a second deposition rate to form the second portion of the nucleation layer 410*b*. In further embodiments, the first and second portions of the nucleation layer 410*a-b* may be formed at the same deposition rate. In yet additional embodiments, the first deposition rate of the first portion of the nucleation layer 410*a* may be less than or about less than or about 4 Å/second, less than or about 3.5 Å/second, less than or about 3 Å/second, less than or about 2.5 Å/second, less than or about 2 Å/second, less than or about 1.5 Å/second, less than or about 1 Å/second, or less. In still further embodiments, the second deposition rate of the second portion of the nucleation layer 410*b* may be greater than 4 Å/second, greater than or about 4.5 Å/second, greater than or about 5 Å/second, greater than or about 5.5 Å/second, greater than or about 6 Å/second, or more. In yet further embodiments, at least one of the first and second portions of the nucleation layer 410*a-b* may be formed at an increasing deposition rate with a lowest deposition rate at the beginning of the deposition. In embodiments the deposition rate ratio between the end and the start of the deposition of the portion of the nucleation layer 410*a-b* may be greater than or about 1.5:1, greater than or about 2:1, greater than or about 2.5:1, greater than or about 3:1, greater than or about 3.5:1, greater than or about 4:1, greater than or about 4.5:1, greater than or about 5:1, or more.

In embodiments, the thickness of the first portion of the nucleation layer 410*a* may be less than or about the thickness of the second portion of the nucleation layer 410*b*. In further embodiments, the first portion of the nucleation layer 410*a* may have thickness of less than or about 1000 nm, less than or about 500 nm, less than or about 250 nm, less than or about 100 nm, less than or about 50 nm, less than or about 40 nm, less than or about 30 nm, less than or about 20 nm, less than or about 10 nm, or less. In yet additional embodiments, the second portion of the nucleation layer 410*b* may have a thickness of greater than or about 10 nm, greater than or about 20 nm, greater than or about 30 nm, greater than or about 40 nm, greater than or about 50 nm, greater than or about 60 nm, greater than or about 70 nm, greater than or about 80 nm, greater than or about 90 nm, greater than or about 100 nm, greater than or about 250 nm, greater than or about 500 nm, greater than or about 1000 nm, greater than or about 1250 nm, greater than or about 1500 nm, or more. In some embodiments, a thinner first portion of the nucleation layer 410*a* may be formed at a lower deposition rate in the same amount of deposition time as a thicker layer deposited at a higher deposition rate. The lower deposition rate may form the first portion of the nucleation layer 410*a* in contact with the substrate 405 with fewer defects and dislocations than a layer formed at a higher deposition rate.

As noted above, an interlayer 412 may be formed between the first and second portions of the nucleation layer 410*a-b* at operation 220. In embodiments, the interlayer 412 is made from material characterized by a lattice structure and thermal expansion coefficient, among other material characteristics, that reduce the stress on the subsequently-deposited second portion of the nucleation layer 410*b*. In further embodiments, the interlayer 412 may be made from a dielectric material such as silicon nitride, silicon oxide, titanium nitride, and gallium oxide, among other dielectric materials. In yet additional embodiments, the interlayer 412 may be characterized by a thickness sufficient to stop the propagation of at least some of the dislocations from the first portion of the nucleation layer 410*a* into the second portion of the nucleation layer 410*b*. In still more embodiments, the interlayer 412 may be formed thin enough to include one or more openings that permit direct contact between the second portion of the nucleation layer 410*b* and the first portion of the nucleation layer 410*a*. In some embodiments, the direct contact between the first and second portions of the nucleation layer 410*a-b* may increase an initial growth rate of the second portion of the nucleation layer 410*b*. In additional embodiments, the interlayer may be formed to a thickness less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less.

In embodiments, the formation of the interlayer 412 at operation 220 may be done without exposing to air the first portion of the nucleation layer 410*a* on substrate 405. In further embodiments, the formation of the interlayer 412 may be done in the same processing chamber as the formation of the first and second portions of the nucleation layer 410*a-b*. In still further embodiments, the formation of the interlayer 412 may be done in a different processing chamber than used for the formation of the first portion of nucleation layer 410*a*, without breaking a vacuum while transferring the substrate between the processing chambers. In embodiments, preventing the first portion of the nucleation layer 410*a* from having contact with air prior to the formation of the interlayer 412 prevents the reaction of the nucleation layer with oxygen and moisture in the air that can contaminate the nucleation layer 410*a-b* and the subsequently-formed gallium-and-nitrogen-containing region 425. In still further embodiments, the interlayer 412 may be formed using chemical vapor deposition (e.g., plasma-enhanced chemical vapor deposition). In yet additional embodiments, the interlayer 412 may be formed using atomic layer deposition (ALD).

Figure 5A:
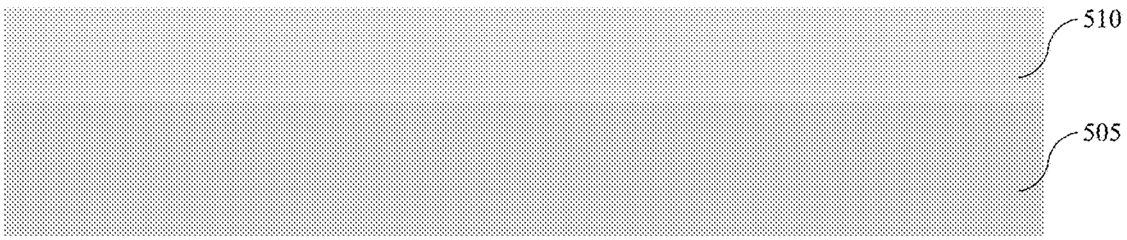
FIGS. 5A-D show yet additional cross-sectional views of semiconductor structures being processed according to embodiments of the present technology.
Figure 5B:
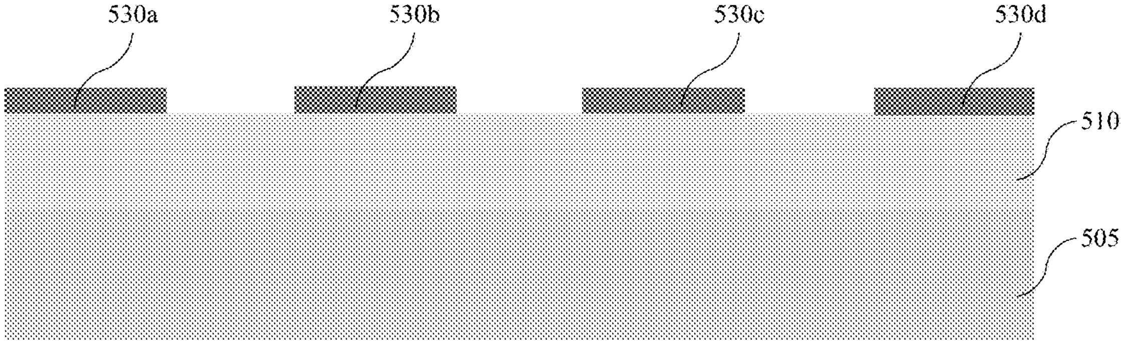
Figure 5C:
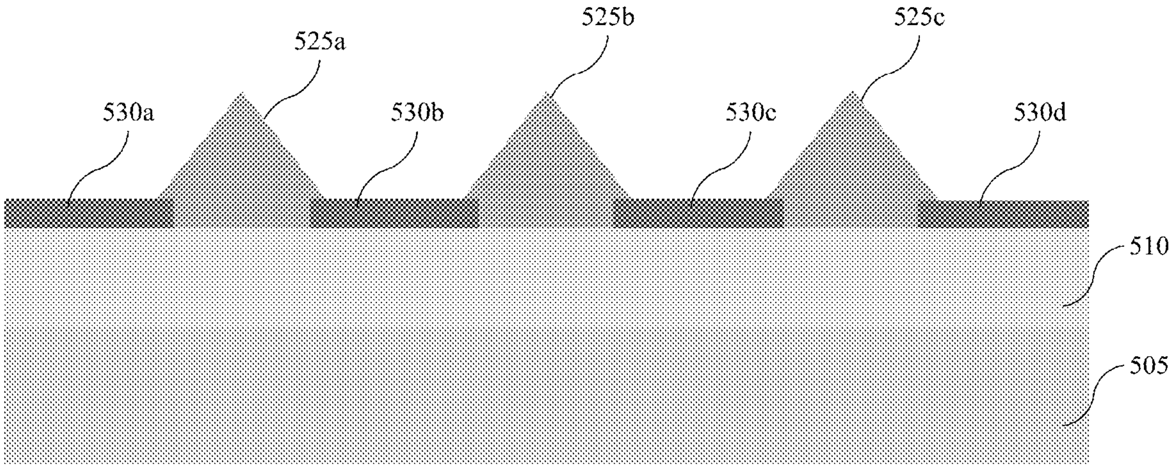

Method 200 may yet also include forming a patterned mask layer on the nucleation layer at operation 230. Referring now to FIGS. 5A-B, the pattern mask layer 530*a-b* may be formed on the nucleation layer 510 in contact with substrate 505. In embodiments, the mask layer may be made from one or more dielectric materials such as silicon oxide, silicon nitride, silicon carbide, amorphous carbon, or silicon-oxy-carbide, among other dielectric materials. The mask layer may be patterned and etched to form openings in the mask layer that permit the growth gallium-and-nitrogen containing materials on the exposed portions of the nucleation layer 510. In additional embodiments, the openings in the patterned mask layer permit the formation of the gallium-and-nitrogen-containing regions 525*a-c*. A longest dimension of the openings of the patterned mask layer 530*a-d* may be less than or about 10 μm, less than or about 5 μm, less than or about 1 μm, less than or about 0.9 μm, less than or about 0.8 μm, less than or about 0.7 μm, less than or about 0.6 μm, less than or about 0.5 μm, less than or about 0.4 μm, less than or about 0.3 μm, less than or about 0.2 μm, less than or about 0.1 μm, or less.

Method 200 may yet also include forming gallium-and-nitrogen-containing regions at operation 235. As noted above, the gallium-and-nitrogen-containing regions may include one or more of gallium nitride (GaN), aluminum-indium-gallium-nitride (AlInGaN), indium-gallium-nitride (InGaN), or aluminum-gallium nitride (AlGaN). In some embodiments, the materials used to make the gallium-and-nitrogen-containing regions may be extended to include other nitride materials such as aluminum-indium-nitride (AlInN) and indium nitride (InN), among other nitride materials. Referring to FIGS. 4C-D, the gallium-and-nitrogen-containing regions 525*a-c* may be formed on portions of the nucleation layer 510 that are exposed through openings in the patterned mask layer 530*a-d*. In embodiments, the gallium-and-nitrogen-containing regions 525*a-c* may be formed in a bottom-up process such as a selective area growth (SAG) process. In further embodiments, gallium-and-nitrogen-containing material may be deposited using metal-organic chemical vapor deposition (MOCVD) of gallium-and-nitrogen-containing material on exposed portions of the nucleation layer 510. In yet more embodiments, the MOCVD may include supplying deposition precursors to a deposition region that includes the deposition surfaces of the nucleation layer 510. In embodiments, the deposition precursors may include one or more alkyl gallium compounds such as trimethylgallium or triethylgallium to provide the gallium component of the gallium-and-nitrogen-containing material that forms the gallium-and-nitrogen-containing regions 525*a-c*. In additional embodiments, the deposition precursors may also include ammonia ($NH_3$) to provide the nitrogen component of the gallium-and-nitrogen-containing material. In some embodiments, the gallium-and-nitrogen-containing regions 525*a-c* may be deposited using molecular beam epitaxy (MBE).

As noted above, in embodiments the gallium-and-nitrogen-containing regions 525*a-c* may include one or more additional components such as aluminum and indium. In these embodiments, the deposition precursors may further include one or more organo-aluminum compounds such as trimethyl-aluminum. In additional embodiments, the deposition precursors may further include one or more alkyl indium compounds such as trimethyl indium. In embodiments, the mole ratio of the one or more additional components may be less than or about 15 mol. %, less than or about 12.5 mol. %, less than or about 10 mol. %, less than or about 9 mol. %, less than or about 8 mol. %, less than or about 7 mol. %, less than or about 6 mol. %, less than or about 5 mol. %, or less. For example, the gallium-and-nitrogen-containing layer may include indium at a level less than or about 15 mol. %, less than or about 14 mol. %, less than or about 13 mol. %, less than or about 12 mol. %, less than or about 11 mol. %, less than or about 10 mol. %, less than or about 9 mol. %, less than or about 8 mol. %, less than or about 7 mol. %, less than or about 6 mol. %, less than or about 5 mol. %, less than or about 4 mol. %, less than or about 3 mol. %, less than or about 2 mol. %, less than or about 1 mol. %, or less.

In embodiments, the mole ratio of the nitrogen to the gallium, and other Group III metals, in the gallium-and-nitrogen-containing regions 525*a-c* may be adjusted through the flow rate of the nitrogen-containing precursors and the gallium-containing precursors. In further embodiments, the flow rate ratio of the nitrogen-containing precursors to the gallium-containing precursors may be greater than or about 50, greater than or about 100, greater than or about 500, greater than or about 1000, greater than or about 5000, greater than or about 10000, greater than or about 20000, greater than or about 30000, or more.

In additional embodiments, the gallium-and-nitrogen-containing regions 525*a-c* may be formed at temperatures selected for the deposition of the precursors on the exposed areas of the nucleation layer 510. In embodiments, the deposition temperature may be characterized as greater than or about 500° C., greater than or about 600° C., greater than or about 700° C., greater than or about 800° C., greater than or about 900° C., greater than or about 1000° C., greater than or about 1100° C., or more. In some embodiments, the deposition temperature for an gallium-and-nitrogen-containing material may adjusted based on the amount of additional components that are present in the material. In embodiments, a gallium-and-nitrogen-containing material that includes a significant amount of indium may be formed at a deposition temperature that is lower than an indium-free gallium-and-nitrogen-containing material. In additional embodiments, a gallium-and-nitrogen-containing material that further includes indium may be deposited at a deposition temperature less than or about 850° C., less than or about 800° C., less than or about 750° C., less than or about 700° C., less than or about 650° C., less than or about 600° C., or less.

In further embodiments, the gallium-and-nitrogen-containing regions 525*a-c* may be formed at deposition pressures that facilitate the formation of the regions. In embodiments, the gallium-and-nitrogen-containing regions 525*a-c* may be formed at deposition pressures greater than or about 10 Torr, greater than or about 50 Torr, greater than or about 100 Torr, greater than or about 200 Torr, greater than or about 300 Torr, greater than or about 400 Torr, greater than or about 500 Torr, greater than or about 600 Torr, greater than or about 700 Torr, or more.

Figure 5D:
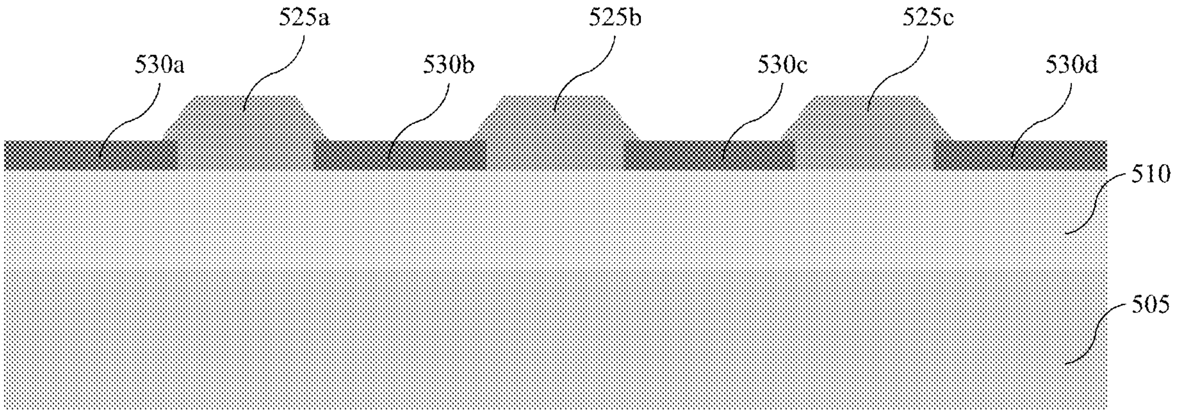

Method 200 may also include planarizing the gallium-and-nitrogen-containing regions 525*a-c* at operation 240. In embodiments, the as-deposited gallium-and-nitrogen-containing regions 525*a-c* may be formed with a pyramidal shape. In further embodiments, the base of the pyramid may be in contact with the nucleation layer 510, while the apex of the pyramid may point in a direction opposite the nucleation layer. In still further embodiments, the apexes of the pyramids may be planarized to form a planar surface (e.g., a c-facet) in the planarized gallium-and-nitrogen-containing regions 525*a-c* as shown in FIG. 5D.

In embodiments, planarizing the gallium-and-nitrogen-containing regions 525*a-c* may include a chemical-mechanical polishing process. In further embodiments, the chemical-mechanical polishing process may be performed after forming a stop layer (not shown) on the mask layer and the gallium-and-nitrogen-containing regions 525*a-c*. In further embodiments, the planarizing process may include an etching process. In embodiments, the apex portion of the gallium-and-nitrogen-containing regions 525*a-c* may be wet etched or dry etched down to an etch-stop layer (not shown).

In yet further embodiments, planarizing the gallium-and-nitrogen-containing regions 525*a-c* may include an annealing process that sublimates off the apex of the pyramidal-shaped region to leave a planar region (sometimes called a c-facet) at the top of the gallium-and-nitrogen-containing regions 525*a-c*. In embodiments, the annealing process may include heating the gallium-and-nitrogen-containing regions 525*a-c* in annealing gases for a designated period of time. In further embodiments, the gallium-and-nitrogen-containing regions 525*a-c* may be annealed at an annealing temperature greater than or about 900° C., greater than or about 1000° C., greater than or about 1100° C., or more. In still further embodiments, the gallium-and-nitrogen-containing regions 525*a-c* may be annealed in one or more annealing gases that may include at least one of ammonia or hydrogen ($H_2$). In still further embodiments, the gallium-and-nitrogen-containing regions 525*a-c* may be annealed for less than or about 10 minutes, less than or about 7.5 minutes, less than or about 5 minutes, or less.

In some embodiments, a flat layer of gallium-and-nitrogen containing material (not shown) may be grown on the nucleation layer 510. In these embodiments, a planarization step may not be necessary. In some of these embodiments, the flat layer of gallium-and-nitrogen containing material may be patterned and etch to form the gallium-and-nitrogen-containing regions 525*a-c*. The gallium-and-nitrogen-containing regions 525*a-c* may be planarized in their as-deposited and etched state.

Embodiments of the present technology form a PVD-deposited nucleation layer in less time, with a lower thermal budget, and with less complexity and cost than conventionally-formed, MOVCD-deposited nucleation layer. The PVD-deposited nucleation layer is formed with a low level of defects that permits the subsequent formation of structurally stable, mechanically-strong, and well-oriented gallium-and-nitrogen-containing regions such as GaN regions. In embodiments, the deposition surface of the nucleation layer upon which the gallium-and-nitrogen-containing regions are grown may be characterized by a defect density of less than or about $5\times10^3/cm^2$, less than or about $1\times10^3/cm^2$, less than or about $5\times10^2/cm^2$, less than or about $1\times10/cm^2$, or less. The low defect densities and high throughput efficiency of the present PVD-deposited nucleation layers permits the production of high quality, low-cost GaN-containing semiconductor devices for a variety of applications including high-power transistors, semiconductor power devices, radio-frequency devices, photovoltaic devices, light emitting diodes, and solid-state lasers, among other applications.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a trench" includes a plurality of such trenches, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

forming a nucleation layer on a substrate, wherein the nucleation layer is formed by physical vapor deposition using a sputtering gas and a sputtering target, wherein the physical vapor deposition is characterized by a deposition temperature of greater than or about 400° C., and wherein the forming of the nucleation layer comprises:

forming a first portion of the nucleation layer at a first PVD deposition rate; and forming a second portion of the nucleation layer at a second PVD deposition rate that is greater than the first PVD deposition rate;

forming a patterned mask layer on the nucleation layer, wherein the patterned mask layer comprises openings that expose portions of the nucleation layer; and forming gallium-and-nitrogen containing regions on the exposed portions of the nucleation layer.

2. The semiconductor processing method of claim 1, wherein the substrate comprises silicon.

3. The semiconductor processing method of claim 1, wherein the nucleation layer comprises at least one metal nitride selected from the group consisting of aluminum nitride, hafnium nitride, niobium nitride, zirconium nitride, titanium nitride, and tungsten nitride.

4. The semiconductor processing method of claim 1, wherein the patterned mask layer comprises silicon oxide, silicon-oxy-carbon, silicon nitride, titanium nitride, aluminum oxide, or amorphous carbon.

5. The semiconductor processing method of claim 1, wherein the formation of the nucleation layer further comprises forming an interlayer on the first portion of the nucleation layer before the formation of the second portion of the nucleation layer, wherein the interlayer comprises silicon nitride.

6. The semiconductor processing method of claim 1, wherein the forming of the gallium-and-nitrogen containing regions comprises the formation of gallium nitride regions with metal-organic chemical vapor deposition.

7. The semiconductor processing method of claim 6, wherein the method further comprises annealing the gallium-and-nitrogen-containing regions.

8. A semiconductor processing method comprising:

forming a first portion of a nucleation layer on a silicon substrate at a first power level of less than 1 kW, wherein the first portion of the nucleation layer is formed by physical vapor deposition;

forming an interlayer on the first portion of the nucleation layer, wherein the interlayer is characterized by a thickness of less than or about 10 nm, and wherein the interlayer comprises at least one opening to expose the first portion of the nucleation layer;

forming a second portion of the nucleation layer on the interlayer at a second power level greater than the first power level, wherein the first portion of the nucleation layer and the second portion of the nucleation layer comprise the same material, and wherein the second portion of the nucleation layer is characterized by fewer dislocations than the first portion of the nucleation layer; and forming at least one gallium-and-nitrogen containing region on at least one exposed part of the second portion of the nucleation layer.

9. The semiconductor processing method of claim 8, wherein the first and second portions of the nucleation layer comprises aluminum nitride.

10. The semiconductor processing method of claim 8, wherein the interlayer comprises silicon nitride.

11. The semiconductor processing method of claim 8, wherein the at least one gallium-and-nitrogen containing region comprises gallium nitride deposited by metal-organic chemical vapor deposition.

12. The semiconductor processing method of claim 8, wherein the first and second portions of the nucleation layer are deposited at a PVD deposition temperature greater than or about 700° C.

13. The semiconductor processing method of claim 8, wherein the first portion of the nucleation layer, the interlayer, and the second portion of the nucleation layer are formed without the silicon substrate being exposed to air.

* * * * *